(12) United States Patent
Kuekes et al.

(10) Patent No.: US 7,030,408 B1
(45) Date of Patent: *Apr. 18, 2006

(54) MOLECULAR WIRE TRANSISTOR (MWT)

(75) Inventors: Philip J. Kuekes, Menlo Park, CA (US); R. Stanley Williams, Mountain View, CA (US)

(73) Assignee: Hewlett-Packard Development Company, L.P., Houston, TX (US)

(*) Notice: Subject to any disclaimer, the term of this patent is extended or adjusted under 35 U.S.C. 154(b) by 0 days.

This patent is subject to a terminal disclaimer.

(21) Appl. No.: 09/699,080

(22) Filed: Oct. 26, 2000

Related U.S. Application Data

(62) Division of application No. 09/280,188, filed on Mar. 29, 1999, now abandoned.

(51) Int. Cl.
*H01L 35/24* (2006.01)

(52) U.S. Cl. .......................................... 257/40; 438/99

(58) Field of Classification Search ............ None
See application file for complete search history.

(56) References Cited

U.S. PATENT DOCUMENTS

| | | | |
|---|---|---|---|
| 3,975,623 A | 8/1976 | Weinberger | 235/152 |
| 4,208,728 A | 6/1980 | Blahut et al. | 365/154 |
| 5,475,341 A | 12/1995 | Reed | 327/566 |
| 5,519,629 A | 5/1996 | Snider | 364/490 |
| 5,640,343 A | 6/1997 | Gallagher et al. | 365/171 |
| 5,646,418 A * | 7/1997 | Frazier et al. | 257/4 |
| 5,665,618 A * | 9/1997 | Meyer et al. | 438/172 |
| 5,729,752 A | 3/1998 | Snider et al. | 395/800 |
| 5,790,771 A | 8/1998 | Culbertson et al. | 395/182.01 |
| 6,903,366 B1 * | 6/2005 | Heath et al. | 257/14 |

OTHER PUBLICATIONS

L. Guo et al., "Nanoscale silicon field effect transistors fabricated using imprint lithography," *Applied Physics Letters*, vol. 71, pp. 1881-1883 (Sep. 29, 1997).

(Continued)

*Primary Examiner*—Long Pham
*Assistant Examiner*—Wai-Sing Louie

(57) ABSTRACT

Bipolar and field effect molecular wire transistors are provided. The molecular wire transistor comprises a pair of crossed wires, with at least one of the wires comprising a doped semiconductor material. The pair of crossed wires forms a junction where one wire crosses another, one wire being provided with Lewis acid functional groups and the other wire being provided with Lewis base functional groups. If both wires are doped semiconductor, such as silicon, one is P-doped and the other is N-doped. One wire of a given doping comprises the emitter and collector portions and the other wire comprises the base portion, which is formed by modulation doping on the wire containing the emitter and collector at the junction where the wires cross and between the emitter and collector portions, thereby forming a bipolar transistor. Both NPN and PNP bipolar transistors may be formed. Analogously, one wire may comprise doped semiconductor, such as silicon, and the other wire a metal, the doped silicon wire forming the source and drain and the metal wire forming the gate by modulation doping on the doped silicon wire where the wires cross, between the source and drain, to form a field effect transistor. Both P-channel and N-channel FETs may be formed. The construction of both bipolar transistors and FETs on a nanometer scale, which are self-aligned and modulation-doped, is thereby enabled.

19 Claims, 5 Drawing Sheets

OTHER PUBLICATIONS

L. Guo et al., "A Single-Electron Transistor Memory Operating at Room Temperature," *Science*, vol. 2756, pp. 649-651 (Jan. 31, 1997).

S.J. Trans et al., "Room-temperature transistor based on a single carbon nanotube," *Nature*, vol. 393, pp. 49-52 (May 7, 1998).

K.K. Likharev, "Correlated discrete transfer of single electrons in ultrasmall tunnel junctions", *IBM Journal of Research and development*, vol. 32, pp. 144-158 (Jan. 1998).

Heath, "A defect-Tolerant Computer Architecture: Opportunities for Nanotechnology", *Science*, vol. 280, pp. 1716-1721 (Jun. 12, 1998).

J.R. Heath et al, "A Defect-Tolerant Computer Architecture: Opportunities for Nanotechnology", Science, vol. 280, pp. 1716-1721 (Jun. 12, 1998).

L. Guo et al, "Nanoscale Silicon Field Effect Transistors Fabricated Using Imprint Lithography", Applied Physics Letters, vol. 71, pp. 1881-1883 (Sep. 29, 1997).

A.M. Morales et al, "A Laser Ablation Method For The Synthesis Of Crystalline Semiconductor Nanowires", Science, vol. 279, pp. 208-268 (Jan. 9, 1998).

J.R. Heath et al, "A Liquid Solution Synthesis Of Single Crystal Germanium Quantum Wires", Chemical Physics Letters, vol. 208, No. 3, 4, pp. 263-268 (Jun. 11, 1993).

V.P. Menon et al, "Fabrication and Evaluation Of Nanoelectrode Ensembles", Analytical Chemistry, vol. 67, pp. 1920-1928 (Jul. 1, 1995).

L. Guo et al, "A Silicon Single-Electron Transistor Memory Operating At Room Temperature", Science, vol. 275, pp. 649-651 (Jan. 31, 1997).

S.J. Tans et al, "Room-Temperature Transistor Based On A Single Carbon Nanotube", Nature, vol. 393, pp. 49-52 (May 7, 1998).

K.K. Likharev, "Correlated Discrete Transfer Of Single Electrons In Ultrasmall Tunnel Junctions", IBM Journal of Research and Development, vol. 32, No. 1, pp. 144-158 (Jan. 1998).

R.E. Jones Jr., et al, "Ferroelectric Non-Volatile Memories For Low-Voltage, Low-Power Applications", Thin Solid Films, vol. 270, pp. 584-588 (Dec. 1, 1995.

D.B. Amabilino et al, "Aggregation Of Self-Assembling Branched [n]-Rotaxanes", New Journal of Chemistry, vol. 22, No. 9, pp. 959-972 (Sep. 11, 1998).

T. Vossmeyer et al, "Combinatorial Approaches Toward Patterning Nanocrystals", Journal of Applied Physics, vol. 84, No. 7, pp. 3664-3670 (Oct. 1, 1998).

D.V. Leff et al, "Thermodynamic Control Of Gold Nanocrystal Size: Experiment And Theory", The Jouranl of Physical Chemistry, vol. 99, pp. 7036-7041 (May 4, 1995).

J.D.L. Holloway et al, "Electron-Transfer Reactions Of Metallocenes: Influence Of Metal Oxidation State On Structure And Reacivity", Journal of the American Chemical Society, vol. 101, pp. 2038-2044 (Apr. 11, 1979).

C. Mead et al, "Introduction to VLSI Systems", Addison-Wesley, Ch. 3, Section 10, pp. 79-82 (1980).

C. P. Collier et al, "Electronically Configurable Moelcular-Based Logic Gates", Science, vol. 285, pp. 391-394 (Jul. 16, 1999).

* cited by examiner

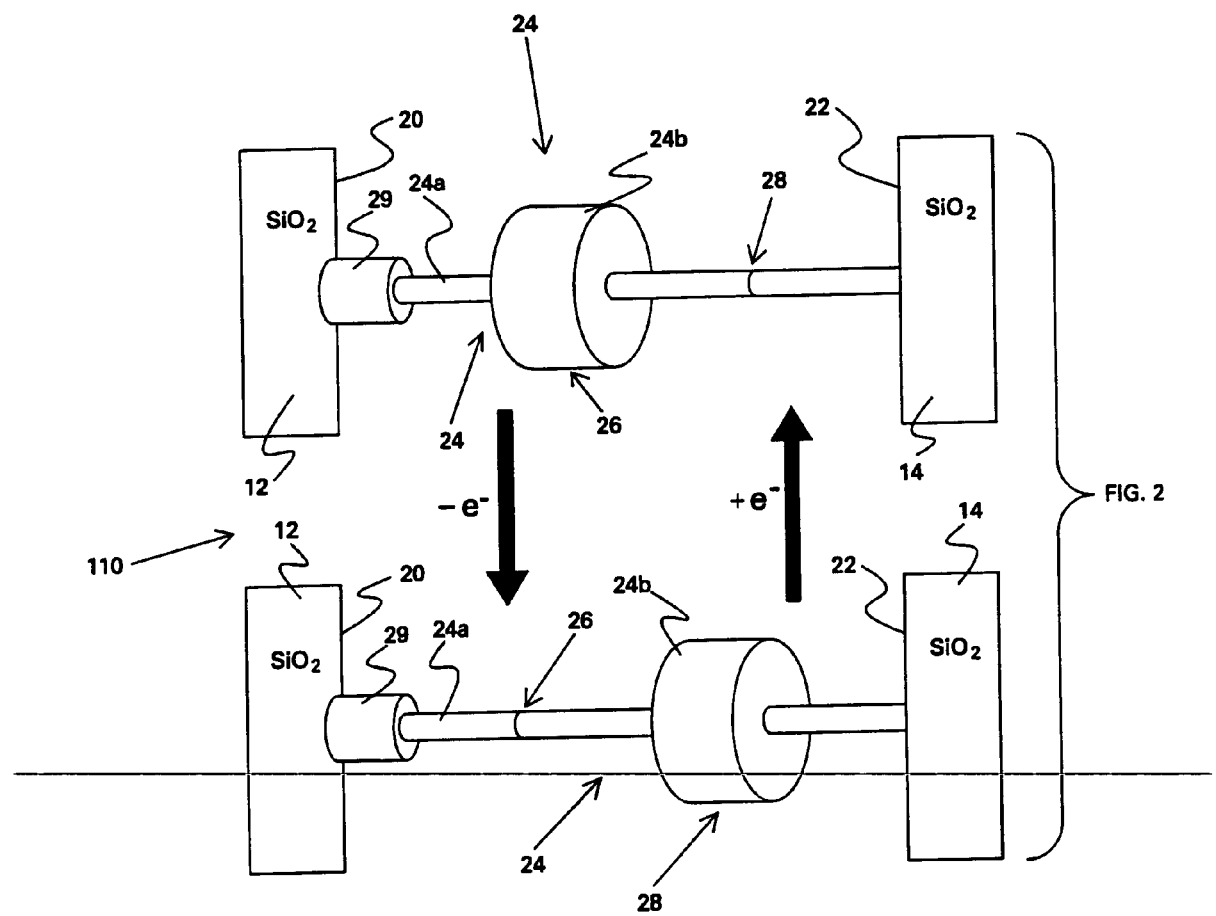

MOLECULAR WIRE TRANSISTOR (MWT)

CROSS-REFERENCE TO RELATED APPLICATIONS

This is a divisional application of application Ser. No. 09/280,188, filed on Mar. 29, 1999, now abandoned. The present application is also related to U.S. Pat. No. 6,559,468, issued on May 6, 2003, which is also a divisional application of Ser. No. 09/280,188.

The present application is related to the following applications: Ser. No. 09/280,225 ("Molecular Wire Crossbar Interconnect (MWCI) for Signal Routing and Communications"), now U.S. Pat. No. 6,314,019, issued Nov. 6, 2001; Ser. No. 09/280,189 ("Molecular Wire Crossbar Memory"), now U.S. Pat. No. 6,128,214, issued Oct. 3, 2000; Ser. No. 09/282,045 ("Molecular Wire Crossbar Logic"); Ser. No. 09/282,049 ("Demultiplexer for a Molecular Wire Crossbar Network (MWCN DEMUX)"), now U.S. Pat. No. 6,256,767, issued Jul. 3, 2001; and Ser. No. 09/282,048 ("Chemically Synthesized and Assembled Electronic Devices"), now U.S. Pat. No. 6,459,095, issued Oct. 1, 2002, all filed on Mar. 29, 1999. The present application employs the chemical synthesis and assembly techniques disclosed and claimed in Ser. No. 09/282,048 (U.S. Pat. No. 6,459,095) and is used in the demultiplexer disclosed and claimed in Ser. No. 09/282,049 (U.S. Pat. No. 6,256,767) and the crossbar interconnections disclosed and claimed in Ser. No. 09/280,225 (U.S. Pat. No. 6,314,019).

TECHNICAL FIELD

The present invention relates generally to electronic devices whose functional length scales are measured in nanometers, and, more particularly, to transistors based on crossed nanometer-scale wires, at least one of which is a modulation-doped semiconductor, joined by functionalized groups at the intersecting junctions.

BACKGROUND ART

The silicon (Si) integrated circuit (IC) has dominated electronics and has helped it grow to become one of the world's largest and most critical industries over the past thirty-five years. However, because of a combination of physical and economic reasons, the miniaturization that has accompanied the growth of Si ICs is reaching its limit. The present scale of devices is on the order of tenths of micrometers. New solutions are being proposed to take electronics to ever smaller levels; such current solutions are directed to constructing nanometer scale devices.

Prior proposed solutions to the problem of constructing nanometer scale devices have involved (1) the utilization of extremely fine scale lithography using X-rays, electrons, ions, scanning probes, or stamping to define the device components; (2) direct writing of the device components by electrons, ions, or scanning probes; or (3) the direct chemical synthesis and linking of components with covalent bonds. The major problem with (1) is that the wafer on which the devices are built must be aligned to within a small fraction of the size of the device features in at least two dimensions for several successive stages of lithography, followed by etching or deposition to build the devices. This level of control does not scale well as device sizes are reduced to nanometer scale dimensions. It becomes extremely expensive to implement as devices are scaled down to nanometer scale dimensions. The major problem with (2) is that it is a serial process, and direct writing a wafer full of complex devices, each containing trillions of components, could well require many years. Finally, the problem with (3) is that high information content molecules are typically macromolecular structures such as proteins and DNA, and both have extremely complex and, to date, unpredictable secondary and tertiary structures that cause them to twist into helices, fold into sheets, and form other complex 3D structures that will have a significant and usually deleterious effect on their desired electrical properties as well as make interfacing them to the outside world impossible.

The present inventors have developed new approaches to nanometer-scale devices, comprising crossed nano-scale wires that are joined at their intersecting junctions with bi-stable molecules, as disclosed and claimed in above-referenced U.S. Pat. No. 6,459,095. Wires, such as silicon, carbon and/or metal, are formed in two-dimensional arrays. A bi-stable molecule, such as rotaxane or pseudorotaxane, is formed at each intersection of a pair of wires. The bi-stable molecule is switchable between two states upon application of a voltage along a selected pair of wires.

Prior solutions to the problem of constructing a nanometer scale transistor (a three-terminal device with gain) involve the precise positioning of three or four components within a nanometer. A proposed prior solution is to position a quantum dot between two wires, which act as the source and drain of the transistor, in tunneling contact with the quantum dot (this is known as a single-electron transistor, or SET, and was originally proposed by K. Likharev); see, e.g., K. K. Likharev, "Correlated discrete transfer of single electrons in ultrasmall tunnel junctions", *IBM Journal of Research and Development*, Vol. 32, pp. 144–158 (January 1998). A third wire is positioned in capacitive contact with the dot, which is the gate. The voltage on the gate changes the energy levels in the quantum dot, which creates a coulomb blockade to current flowing from the source to the drain.

The problem with the foregoing construction is that a total of three wires plus a quantum dot have to be precisely positioned. This precision of placement must clearly be better than the sizes of the components being placed, which are in the order of nanometers. Such devices have been fabricated using conventional lithography, in which case they are so large they must be operated at very low temperatures (near absolute zero). They have also been fabricated using electron beam lithography and utilizing scanning probe microscopes as direct-write tools.

Thus, there remains a need to provide a nanoscale transistor that affords the advantages of prior art devices, while avoiding most, if not all, their disadvantages.

DISCLOSURE OF THE INVENTION

In accordance with the present invention, a molecular wire transistor is provided, comprising a pair of crossed wires, with at least one of the wires comprising a modulation-doped semiconductor material. A first semiconductor wire is of a first conductivity type and a second wire is provided with either Lewis acid functional groups or Lewis base functional groups to create a region of modulation doping of a second and opposite conductivity type in the junction.

If both functionalized wires are doped semiconductor, such as silicon, one is P-doped and the other is N-doped. One wire of a given doping comprises the "emitter" and "collector" portions and the other wire induces the "base" function in the first wire containing the emitter and collector at the junction where the wires cross, between the emitter and collector portions. The "base" region is always modulation-doped in the present invention. Both PNP and NPN transistors that are analogous to bipolar transistors may be formed in this fashion.

One functionalized wire may comprise doped semiconductor, such as silicon, and the other functionalized wire may comprise a metal. Here, the doped semiconductor wire comprises the "source" and "drain" and the metal wire induces the "gate" function on the doped semiconductor wire where the wires cross, between the source and drain, to form a field effect transistor. The "gate" region is always modulation-doped in the present invention. Both N-channel and P-channel transistors that are analogous to field effect transistors may be formed in this fashion.

Further, a molecular memory effect (state change) may be incorporated into the coatings that dope the wires. By choosing the molecule that does the doping of the gate to have two distinct oxidation-reduction (redox) states, a conductive state and a relatively insulating state with a large I–V hysteresis separating the two, it then becomes possible to have a special type of transistor. If the state change is set, then a transistor is formed, but if the state change is not set, then either an open or closed switch is formed. Whether a switch is open or closed depends on the state of a wire coating—whether it is oxidize or reduced.

A second version of molecular memory effect (molecular configuration bit) is to use a bi-stable molecule such that if the memory bit is set, the semiconductor wire is N-doped along its entire length and conducts. But if the memory bit is reset by applying a sufficient voltage difference between the two wires, then the molecule induces a P region through modulation doping, and the semiconductor wire will not conduct across the region where the wires cross. The N and P regions can be interchanged to make another form of the invention.

One embodiment in accordance with the present invention pertains to a method of providing a molecular wire transistor that includes a pair of crossed wires, where at least one of the wires includes a doped semiconductor material. In the present embodiment, a first wire having a first conductivity type and a second wire, with either Lewis acid functional groups or Lewis based functional groups that provide the second wire with a second conductivity type opposite to that of the first wire, are provided. The pair of wires is caused to cross, thereby forming a junction with modulation doping where one wire crosses the other.

The present invention enables the construction of transistors on a nanometer scale, which are self-aligned and modulation-doped. It is very difficult at a nanometer scale to position and align the three components of a bipolar transistor (emitter, base collector) or a field effect transistor (source, gate, and drain). It is also very difficult at a length scale defined in angstroms to control the exact properties of the doping that defines the electrical properties of the semiconductor.

The present invention allows transistors to be formed with a size on the order of tens of nanometers to a few nanometers. By choosing the molecules which form the doping layer, it is possible to build transistors with a wide variety of specifically desired electrical properties. The inclusion of an electrically settable memory bit, through an electrochemical reaction with a large hysteresis loop in its I–V characteristic, as part of the molecules that define the gate region allows a new and useful function to be added to transistors. Another advantage of this invention is that the same technology allows one to choose to build both NPN and PNP bipolar transistors as well as P-channel and N-channel FETs.

BRIEF DESCRIPTION OF THE DRAWINGS

FIG. 2 is a schematic representation of two crossed nanowires, joined by a rotaxane, and depicting the two bi-stable states;

BEST MODES FOR CARRYING OUT THE INVENTION

Definitions

Figure 1A:
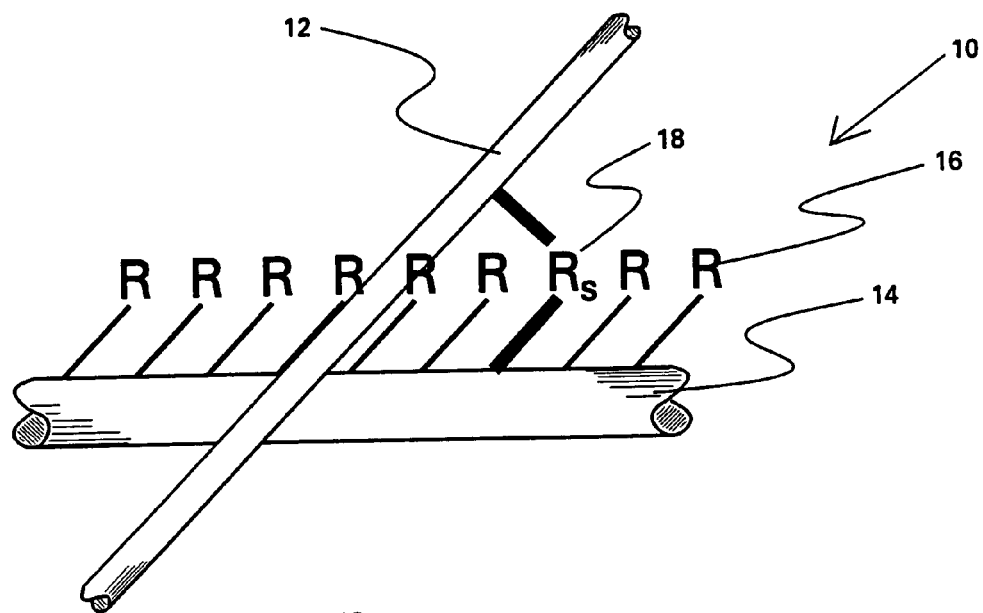
FIG. 1A is a schematic representation of two crossed nano-scale wires, with at least one molecule bridging the gap in accordance with the invention.

As used herein, the term "self-aligned" as applied to "junction" means that the junction that forms the switch and/or other electrical connection between two wires is created wherever two wires, either of which may be coated or functionalized, cross each other, because it is the act of crossing that creates the junction.

The term "self-assembled" as used herein refers to a system that naturally adopts some geometric pattern because of the identity of the components of the system; the system achieves at least a local minimum in its energy by adopting this configuration.

The term "singly configurable" means that a switch can change its state only once via an irreversible process such as an oxidation or reduction reaction; such a switch can be the basis of a programmable read only memory (PROM), for example.

The term "reconfigurable" means that a switch can change its state multiple times via a reversible process such as an oxidation or reduction; in other words, the switch can be opened and closed multiple times such as the memory bits in a random access memory (RAM).

The term "bi-stable" as applied to a molecule means a molecule having two relatively low energy states. The molecule may be either irreversibly switched from one state to the other (singly configurable) or reversibly switched from one state to the other (reconfigurable).

Micron-scale dimensions refers to dimensions that range from 1 micrometer to a few micrometers in size.

Sub-micron scale dimensions refers to dimensions that range from 1 micrometer down to 0.04 micrometers.

Nanometer scale dimensions refers to dimensions that range from 0.1 nanometers to 50 nanometers (0.05 micrometers).

Micron-scale and submicron-scale wires refers to rod or ribbon-shaped conductors or semiconductors with widths or diameters having the dimensions of 1 to 10 micrometers, heights that can range from a few tens of nanometers to a micrometer, and lengths of several micrometers and longer.

A crossbar is an array of switches that connect each wire in one set of parallel wires to every member of a second set of parallel wires that intersects the first set (usually the two sets of wires are perpendicular to each other, but this is not a necessary condition).

Crossed Wire Switch

In above-referenced related U.S. Pat. No. 6,459,095, a basic scheme for chemically synthesized and assembled electronic devices is provided. That patent discloses and claims a quantum state switch, which comprises an adjustable tunnel junction between two nanometer-scale wires. In accordance with that invention, an electronic device is provided, comprising two crossed wires having nanometer dimensions, provided with functionalizing groups that control conductivity type of the wires. A plurality of such crossed wires may be assembled to provide a variety of different devices and circuits.

That invention enables the construction of electronic devices on a nanometer scale using relatively stiff wires that are chemically fuctionalized to provide the desired electronic properties and which are then chemically-assembled to create active electronic devices simply by forming contact with other wires.

Figure 1B:
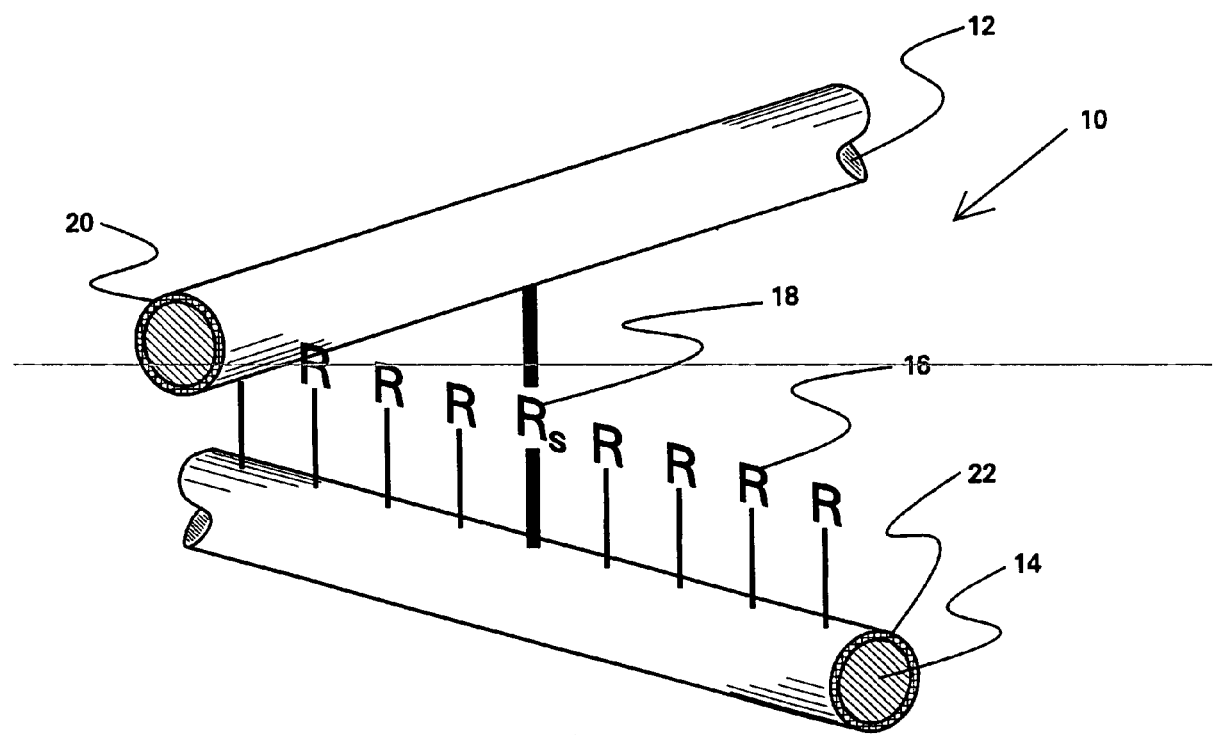
FIG. 1B is a perspective view, depicting the device shown in FIG. 1A.

The essential device features are shown in FIGS. 1A–1B. A crossed wire switch 10 comprises two wires 12, 14, each either a metal or semiconductor wire, that are crossed at some non-zero angle. In between those wires is a layer of molecules or molecular compounds 16, denoted R in FIGS. 1A and 1B. The particular molecules 18 (denoted $R_s$) that are sandwiched at the intersection, or junction, of the two wires 12, 14 are identified as switch molecules. When an appropriate voltage is applied across the wires, the switch molecules are either oxidized or reduced. When a molecule is oxidized (reduced), then a second species is reduced (oxidized) so that charge is balanced. These two species are then called a redox pair. One example of this device would be for one molecule to be reduced, and then a second molecule (the other half of the redox pair) is oxidized. In another example, a molecule is reduced, and one of the wires is oxidized. In a third example, a molecule is oxidized, and one of the wires is reduced. In a fourth example, one wire is oxidized, and an oxide associated with the other wire is reduced. In all cases, oxidation or reduction will affect the tunneling distance or the tunneling barrier height between the two wires, thereby exponentially altering the rate of charge transport across the wire junction, and serving as the basis for a switch.

Further, FIG. 1B depicts a coating 20 on wire 12 and a coating 22 on wire 14. The coatings 20, 22 may be modulation-doping coatings, tunneling barriers (e.g., oxides), or other nano-scale functionally suitable materials. Alternatively, the wires 12, 14 themselves may be coated with one or more R species 16, and where the wires cross, $R_s$ 18 is formed.

That invention allows electronic devices to be formed with a size on the order of tens of nanometers to a few nanometers simply by making contact between two wires. By choosing the molecules which form a doping layer on the wires (modulation doping), it is possible to build devices with a wide variety of specifically desired electrical properties. The possibility of reversibly or even irreversibly changing the properties of the device via an electrochemical reaction with a large hysteresis loop in its I–V characteristic enables devices to be altered after they are built and may provide new and useful functions.

The electronic device 10 of that invention, in its simplest state, is a quantum state switch comprising an adjustable tunnel junction 18 between two nanometer-scale wires 12, 14. A plurality of sets of wires, one set configured at an angle to the other, provides a two-dimensional array of switches. The wires are provided with a molecular species 16 at the junctions 18 that, in one embodiment, is bi-stable. The molecule species is addressed by setting voltages on the appropriate two wires. Thus, by the simple process of crossing one type of coated wire over the other, a switch is formed at wherever the intersection occurs; the exact position of the connecting point is not important for this architecture. Furthermore, the chemical species that form the molecular link between the wires can be electrochemically oxidized or reduced. Some types of molecules can be cycled reversibly and others will react irreversibly. The chemical state of the molecular switches determines the tunneling resistance between the two wires, which is exponentially dependent on both the width and the barrier height of the tunneling gap.

An example of a bi-stable molecular switch 110 is shown in FIG. 2, comprising a rotaxane 24. The rotaxane 24 contains two molecular components—a backbone 24a that contains one or more binding sites, and a circular molecule (the 'ring') 24b that fits around the backbone like a ring on a post. The ring 24b is in intimate mechanical contact, but is not chemically bonded to the backbone 24a. Depending on how the ring is fabricated, the ring may have one or more preferred minimum-energy locations along the backbone. In FIG. 2, these sites are denoted 26 (left site) and 28 (right site).

The moiety 29 on the left side of the rotaxane 24 shows that the molecule is asymmetric and therefore can have different properties when oxidized than when reduced.

Molecular Wire Transistor

A. Diodes

Essential to the fabrication of transistors, first, the fabrication of diodes employing the teachings of the present invention must be understood.

Figure 3:
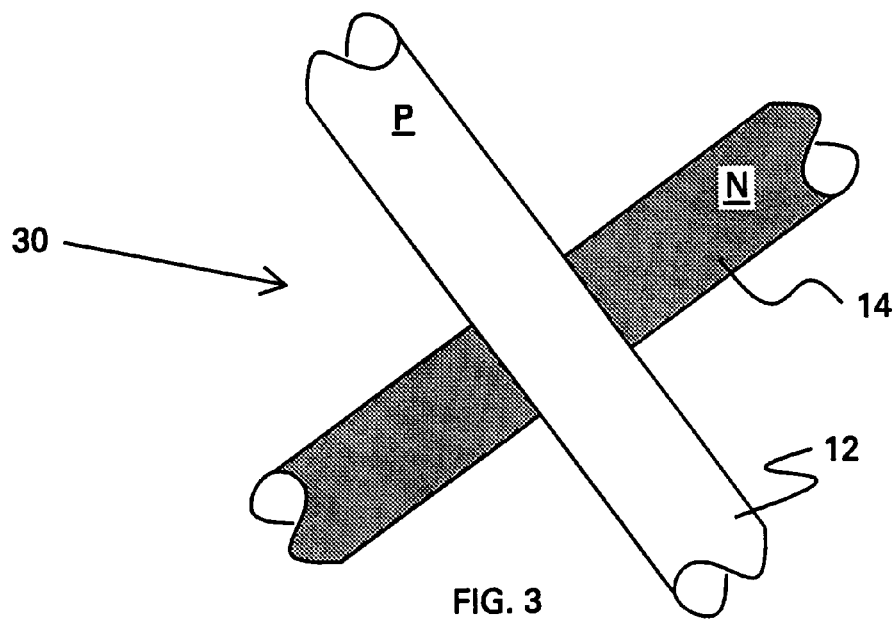
FIG. 3 is a representation similar to that shown in FIG. 1A, depicting a diode formed by two crossed nano-scale wires.

FIG. 3 shows the intersection of two wires 12, 14 that have been separately doped, one to be a P-type semiconductor, the other to be an N-type semiconductor. The wires 12, 14 are manufactured by the same process, and then doped separately to form the two wire types. After forming the doped wires, they are brought together to form a diode 30. This is very different from existing integrated circuit processes that make and dope the semiconductor components in the place where they are to be used. The diode shown in FIG. 3 is a self-assembling device that has the design parametric advantages that lithographically-formed devices have: the engineer designing the circuits can control the dimensions and the strength of the doping and thus the electrical properties.

B. "Bipolar" Transistors

The intrinsic difficulty in constructing a transistor at a nanometer size is that three components have to be brought together with a precise geometric relationship. The bipolar molecular wire transistor (MWT) of the present invention is constructed simply by crossing two differently doped semiconductor molecular wires together at a point. The point can be anywhere along either wire; the topological fact that the wires intersect creates the bipolar transistor. Wherever the point of intersection is, a transistor will be formed. The four ends of the two wires are the electrical contacts to the resultant transistor. The two ends of the first wire are functionally equivalent to the collector and emitter of a conventional bipolar transistor. Both ends of the second wire are connected to the base.

The principal advantage of the molecular wire transistor is that a three-terminal device that has gain can be created using an assembly method which uses chemical properties and self-assembly, rather than requiring extreme precision in co-locating four or five objects to within a few nanometers of each other. The fabrication of this MWT relies only on topology, i.e., the fact that anywhere two wires intersect, the device is formed. By creating such a device where one wire is doped, such as to change the electrical properties of the other wire, either NPN or PNP bipolar transistors can be formed. The type of transistor desired is formed by choosing the molecules that are applied to the surfaces of the two semiconducting wires used to form the transistor; see FIG. 4. This control can be determined by the intrinsic strength, e.g., the pKa of the Lewis acids or bases (molecular electron acceptors or donors, respectively) of the two different molecules used to coat the wires, or it can depend on the relative concentrations of the two types of molecules on the molecular wires. Thus, control is achieved as to which doping type will dominate the other when the wires cross.

Figure 4:
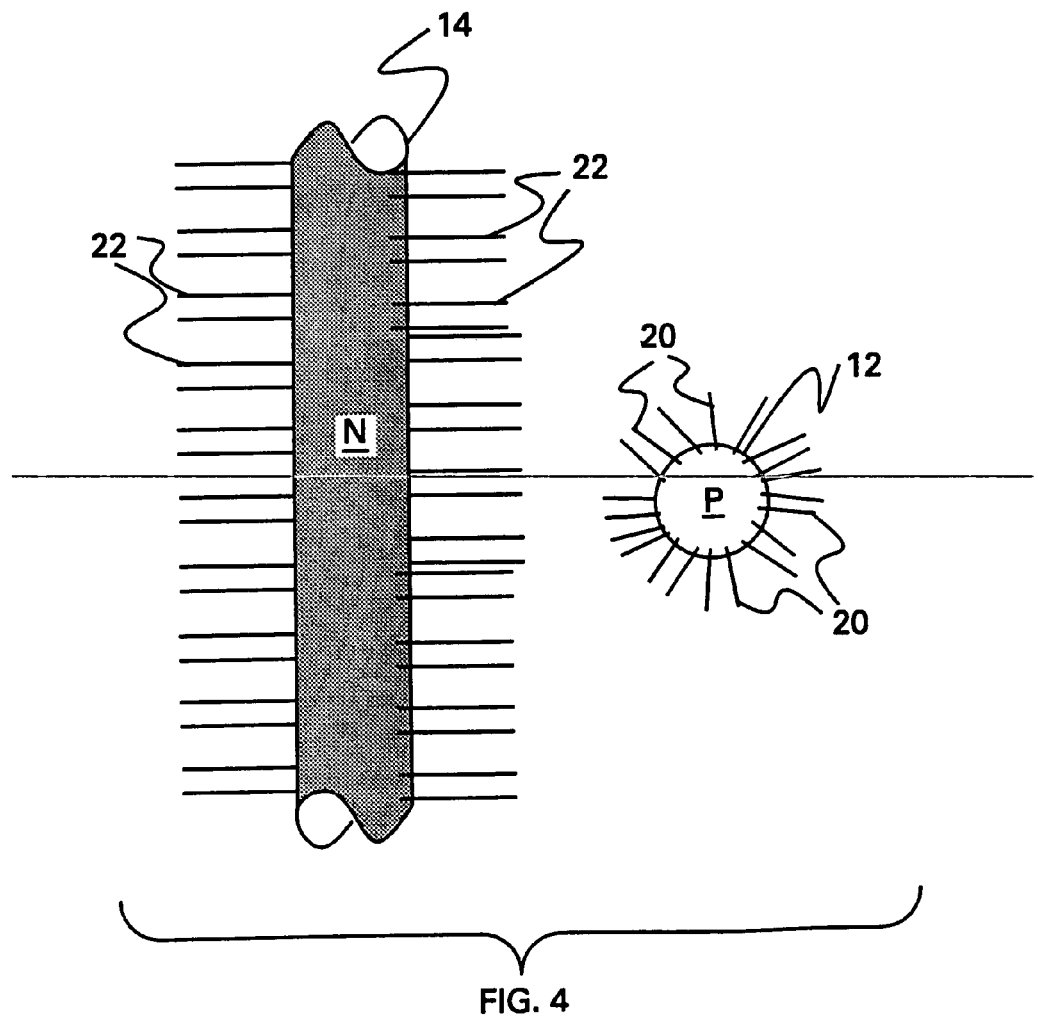
FIG. 4 is a representation similar to that of FIG. 1B, but showing two separate wires having modulation doping from external molecular coatings, prior to forming a transistor.

FIG. 4 depicts wires 12, 14 with modulation doping from external molecular coatings 20, 22, respectively. Wire 12 is shown in plan end view, while wire 14 is shown in side elevation view. The two wires 12, 14 are composed of a semiconducting material, such as silicon, and can both be made by the same process if the device they form is a homojunction, e.g., P—Si/N—Si. It will be appreciated that heterojunctions are made by crossing different wire types, e.g., Si/Ge or semiconductor/metal. Other semiconductor materials, such as III–V and II–VI, may also be used.

In one embodiment, the wires 12, 14 are functionalized, as shown by lines 20, 22, representing functional groups. Functionalization is achieved by forming different external molecular coatings in separate processes. The nature of the coating determines the electronic properties of the wire. For example, electron withdrawing groups (Lewis acids), such as ammonia, hydrogen sulfide, amines, and sulfides, form P-type coatings 20 and electron donating groups (Lewis bases), such as boron-containing compounds (e.g., $BF_3$), form N-type coatings 22. The lengths of the tails of the molecular dopants 20, 22 will control the separation of the wires 12, 14 at their contact point.

Figure 5:
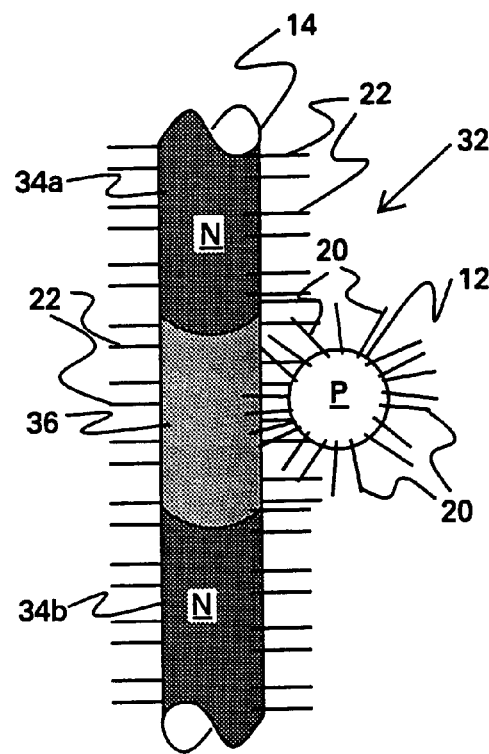
FIG. 5 is a representation similar to that of FIG. 4, where both wires are doped semiconductors, but showing the formation of a molecular wire bipolar transistor, here, NPN (collector-base-emitter)

FIG. 5 illustrates the structure of a transistor 32 of the present invention that is analogous, and functionally equivalent, to a bipolar transistor. The two ends of one wire 14 form the emitter 34a and collector 34b. Both ends of the other wire 12, being of opposite conductivity, define a very localized region 36 in first wire 14. The localized region 36 is defined by the diameter of the wire 12 that induces the base of the transistor 32 and thereby defines the emitter 34a and collector 34b. On the other wire 14, which becomes the actual transistor, the length of the base 36 is determined by the diameter of the gate wire 12 and the concentration and pKa of the doping molecules attached to the surface of that wire compared to those on the transistor wire 14. The standoff distance from the base-forming wire 12 to the base 36 itself is controlled by the length of the doping molecules 20. This potentially provides a great deal of control over all the design parameters, and thus allows production of the desired electrical properties of a transistor for specific functions or to meet other circuit constraints. If the base 36 is too narrow, tunneling across the base may prevent it from acting as a transistor. By choosing the specific molecules and their concentration on the surfaces of the semiconductor wires 12, 14, the degree of N and P doping of the semiconductors which make up the transistor 32 can be controlled. All of these controls are chemical in nature. They can be applied to trillions (or even moles) of molecular wires in parallel. Unlike lithographically-formed transistors, the properties of the transistors are not determined by mechanical precision in their fabrication.

The base 36 is created in the wire 14 by the relative imbalance of doping between the two wires 12, 14, and depends on the relative strength (relative concentration) of the particular Lewis acid and Lewis base combination employed.

As shown in FIG. 5, the P-type dopant (Lewis acid molecules) dominates the N-type dopant (Lewis base) 34 in the region 36 (the gate) to form an NPN bipolar transistor 32. Analogously, N-type dopants in wire 12 could dominate P-type dopants in wire 14 to form a PNP bipolar transistor (not shown, but the same construction, with the N- and P-types reversed).

While the foregoing description is primarily directed to providing each wire with a Lewis acid or Lewis base coating, in fact, only one of the wires need be so coated, with the other wire, being a doped semiconductor of a conductivity type opposite to that provided by the Lewis acid or Lewis base coating on the other wire.

"Field Effect" Transistors

Figure 6:
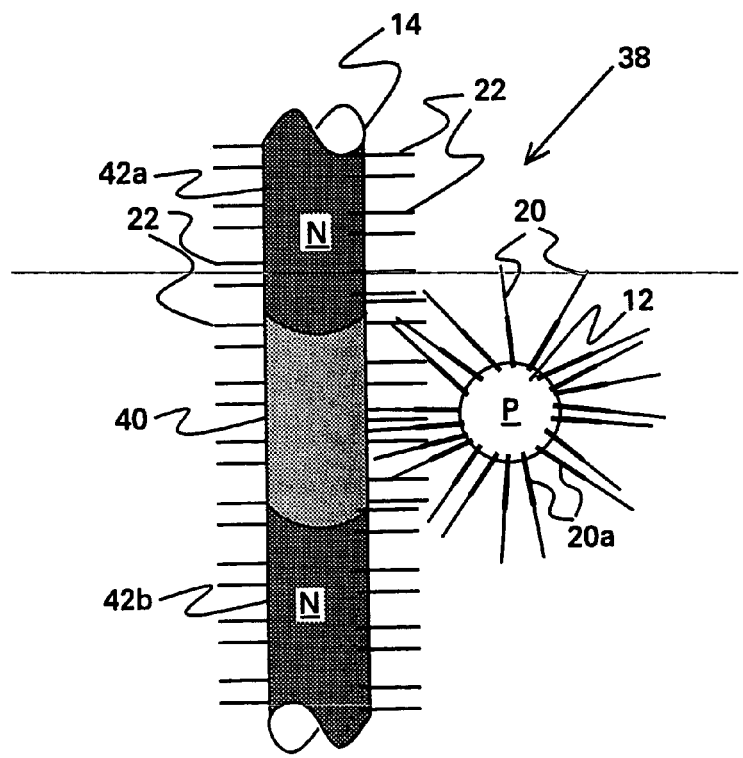
FIG. 6 is a representation similar to that of FIG. 5, where one wire is doped semiconductor and the other wire is metal, showing the formation of a molecular wire field effect transistor, here, P-channel.

It is also possible, in accordance with the present invention, to have only one of the wires, say, wire 14, made of a semiconductor, and to have the other wire 12 made of a metal. This permits formation of a field effect transistor (FET) 38, in which the semiconductor wire 14 becomes the transistor and the metal wire 12 induces formation of a gate 40 in the semiconductor wire. FIG. 6 depicts this structure, which depends on the molecules that induce the gate 40 of the FET 38 creating a sufficient standoff distance from the metal wire 12 to insulate it from the gate. The gate 40 is formed between source and drain regions 42a, 42b, which, in fact, are defined by the creation of the gate in wire 14.

Examples of the metal comprising the metal wire include, but are not limited to, aluminum, silver, gold, titanium, copper, cobalt, nickel, and alloys thereof, as well as cobalt silicide, titanium silicide, and nickel silicide.

The structure of the FET 38, where both the pKa of the doping molecules and the effective standoff distance can be independently controlled, thereby permits independent control of different design parameters of the resulting FET 38. There is experimental evidence that semiconductors will form FETs at these nanometer dimensions; see, e.g., L. Guo et al, "Nanoscale silicon field effect transistors fabricated using imprint lithography", *Applied Physics Letters*, Vol. 71, pp. 1881–1883 (29 Sep. 1997); L. Guo et al, "A Single-Electron Transistor Memory Operating at Room Temperature", *Science*, Vol. 275, pp. 649–651 (31 Jan. 1997); and S. J. Tans et al, "Room-temperature transistor based on a single carbon nanotube", *Nature*, Vol. 393, pp. 49–52 (7 May 1998).

In one embodiment, as shown in FIG. 6, the portions 20a of the molecules coating the metal wire 12 are insulating and control the stand-off distance and thus the effective capacitance and field at the gate 40. The portions 20 of the molecules attached to the metal wire 12 are Lewis acid groups, and thus create, or induce, a P-type semiconducting region 40 (the gate) in the nominally N-type wire 14, which is coated with a Lewis base 22. The resulting transistor is referred to as a P-channel FET. Conversely, we could have a nominally P-type wire 14, which is coated with a Lewis acid, and a metal wire 12 provided with insulating molecular portions and Lewis base groups to form an N-channel FET of the opposite type (not shown, but the same construction, with the N- and P-types reversed). Both types (P-channel and N-channel) could be used in conjunction in much the same way as CMOS transistors are presently used.

While the foregoing description is primarily directed to providing the semiconductor wire with a Lewis acid or Lewis base coating, in fact, that wire may alternatively be a doped semiconductor wire.

Further Considerations

In actual construction, it is possible that a hybridization of both types of transistors, bipolar and FET, may be formed.

Further, the fabrication of bipolar transistors and FETs described above relies only on the nature of the wires 12, 14 and on the nature of the coatings 20, 22 on the wires, respectively. However, incorporating the teachings of a crossed wire switch, discussed above, which employs a bi-stable molecule at the junction of the two wires, it becomes possible to incorporate a molecular memory effect (state change) into the coatings that dope the wires. For example, by choosing the molecule that does the doping of the gate 40 to have two distinct oxidation-reduction (redox) states, a conductive state and a relatively insulating state with a large I–V hysteresis separating the two, it then becomes possible to have a special type of transistor. If the state change is set, then a transistor is created, but if the state change is not set, then either an open or closed switch exists. The open or closed condition of the switch is determined by the chemical state of the coatings on the wires—oxidized or reduced. Alternatively, a separate bi-stable molecule 16, which forms a junction at 18, could be provided, separate and distinct from the two wire coatings 20, 22. The bi-stable molecule 16 may be irreversible (singly configurable) or reversible (reconfigurable).

The state change is induced by biasing the wires with a voltage that is greater than the operating voltage of the transistor. The transistor 32, 38 typically operates in the range of about 0.5 to 1 V. The voltage inducing the state change is at least twice this value. Alternatively, voltage of the opposite polarity may be used to induce the state change.

Figure 7:
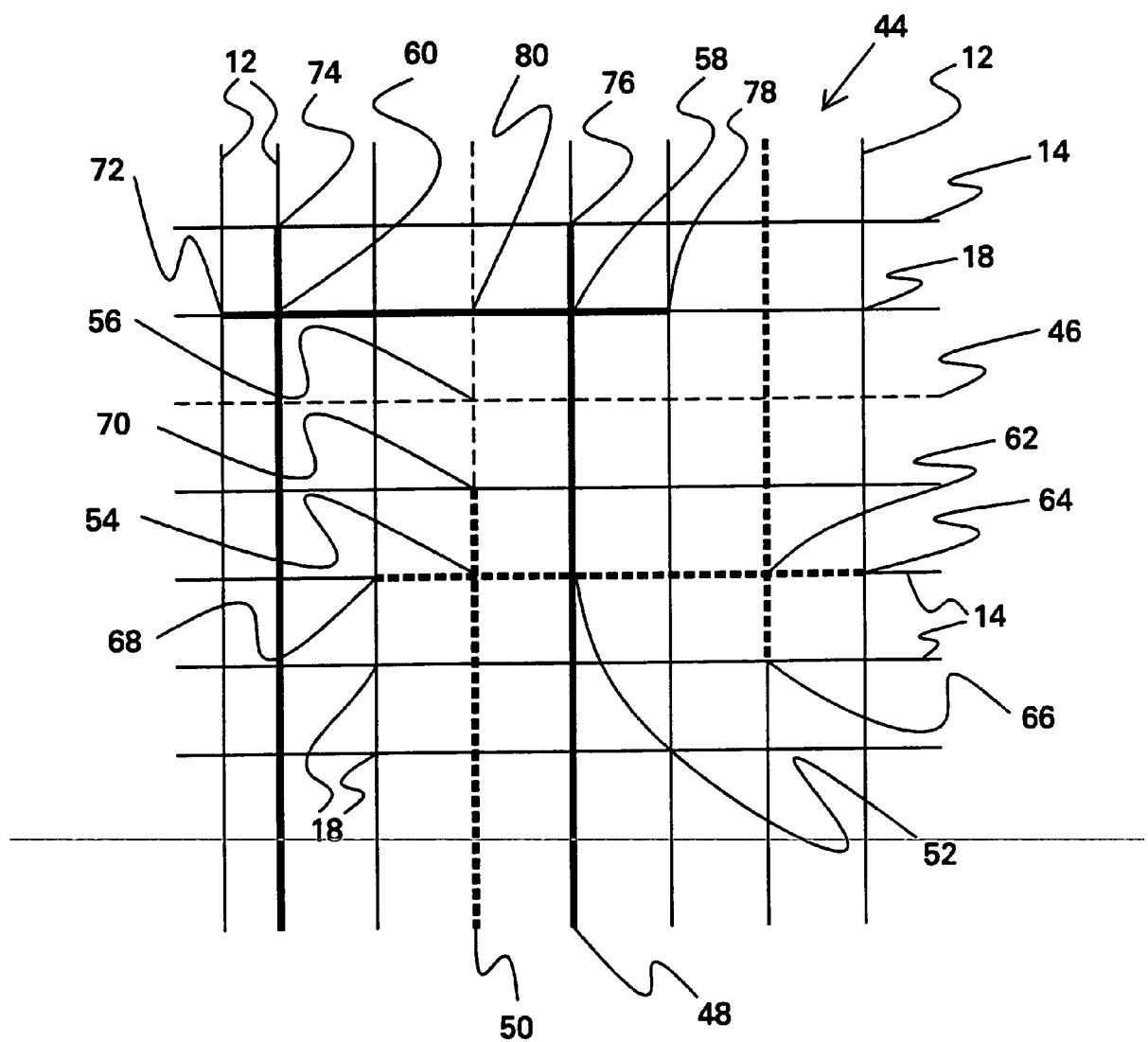
FIG. 7 is a schematic diagram depicting a crossbar interconnect and showing the features that enable construction of an arbitrarily complex integrated circuit.

FIG. 7 presents an embodiment of a crossbar 44 which employs the molecular wire transistors 32, 38 of the present invention. The crossbar 44, which is disclosed and claimed in above-referenced U.S. Pat. No. 6,314,019, consists of a layer of vertical nanowires 12 and a layer of horizontal nanowires 14. Junctions 18 are formed where the vertical wires 12 and the horizontal wires 14 cross. Distinct electrical nets (one indicated by dashed lines 46, one indicated by heavy solid lines 48, and one indicated by dotted lines 50) may be created in the crossbar 44 as part of an integrated circuit. These separate circuits 46, 48, 50 can cross each other without being electrically connected where a crossbar switch is open, denoted 52 (not conducting current). Alternatively, horizontal and vertical wires may be electrically connected by switches that are closed, denoted 54, 56, 58, 60, 62. Circuits may be confined to segments of horizontal or vertical crossbar wires by controlled oxidation of a nanowire to make an electrically open switch, denoted 64, 66, 68, 70, 72, 74, 76, 78. By using the voltage across the electrochemical cell formed by each pair of crossed nanowires to make and break electrical connections both along wires in a layer (segmented wires) and between wires in two layers (vias), one can create an integrated circuit of arbitrarily complex topology. The wires may connect to an electronic device (e.g., resonant tunneling diode or transistor) (not shown) external to the crossbar array 44. Alternatively two or more nets, e.g., 46, 48 may connect to an electronic device 80 (e.g., resonant tunneling diode or transistor) internal to the crossbar array 44. The electronic device, whether external or internal 80, may comprise a transistor 32, 38 of the present invention.

In the circuit depicted in FIG. 7, it is to be understood that all pairs of wires 12, 14 which cross will have the switch 18 between them open unless it specifically intended to be closed by the design of the integrated circuit. The freedom of a circuit designer to arbitrarily select the mixture of device types and interconnect topologies (of which FIG. 7 only shows arbitrary examples) makes the circuit valuable.

Thus, there has been disclosed molecular wire transistors, both bipolar and FETs, comprising crossed nanometer-scale wires, with two wires comprising oppositely-doped semiconductors (a bipolar transistor where the base is modulation-doped) or one wire comprising a doped semiconductor and the other a coated metal wire (an FET where the gate is modulation-doped). In either case, both wires are joined by functionalized groups at the intersecting junctions. It will be apparent to those skilled in this art that various changes and modifications of an obvious nature may be made, and all such changes and modifications are considered to fall within the scope of the appended claims.

The invention claimed is:

1. A method of providing a molecular wire transistor comprising a pair of crossed wires, said method comprising:
   providing a first said wire having a first conductivity type, wherein said first wire comprises a semiconductor material,
   providing a second said wire with either Lewis acid functional groups or Lewis base functional groups to provide said second wire with a second conductivity type opposite to that of said first wire, and
   causing said pair of wires to cross, thereby forming a junction with modulation doping where one wire crosses another, wherein a dimension of said first wire in the direction of the shortest line between said pair of crossed wires is nanoscopic.

2. The method of claim 1 wherein the other wire is nanoscopic or larger in the direction of the shortest line between the two wires.

3. The method of claim 1 wherein one of said wires comprises N-doped semiconductor and the other wire comprises P-doped semiconductor.

4. The method of claim 3 wherein one wire of a given doping induces a base region by modulation doping in said other wire around said junction, thereby defining emitter and collector regions on either side of said base region in said other wire.

5. The method of claim 4 wherein said emitter and collector regions comprise P-type dopant and said base region comprises N-type dopant.

6. The method of claim 4 wherein said emitter and collector regions comprise N-type dopant and said base region comprises P-type dopant.

7. The method of claim 1 wherein said second wire comprises a metal.

8. The method of claim 7 wherein said functional groups on said metal wire comprise a first portion that is electrically insulating and extends from said metal wire and a second portion joined to said first portion comprising said Lewis acid or base functional group and wherein said metal wire induces a gate region in said doped semiconductor wire around said junction, thereby defining source and drain regions on either side of said gate region in said other wire.

9. The method of claim 8 wherein an N-channel field effect transistor is formed.

10. The method of claim 8 wherein a P-channel field effect transistor is formed.

11. The method of claim 1 wherein said second wire also comprises a semiconductor material and wherein both said semiconductor wires are provided with functional groups, one said wire being provided with Lewis acid functional groups and the other said wire being provided with Lewis base functional groups.

12. The method of claim 1 wherein either said Lewis acid functional groups or said Lewis base functional groups have two distinct oxidation-reduction states, a conductive state and a relatively insulating state with a large I–V hysteresis separating the two states, to form a state change transistor or a switch that is capable of being set by application of a voltage that is larger than the voltage at which the transistor operates.

13. The method of claim 12 wherein said state change is set, thereby forming a transistor.

14. The method of claim 12 wherein said state change is not set, thereby forming either an open or closed switch.

15. The method of claim 1 wherein external coatings on said first and second wires provide said modulation doping.

16. The method of claim 15 wherein said external coatings comprise P-type coatings.

17. The method of claim 15 wherein said external coatings comprise N-type coatings.

18. The method of claim 1 wherein said dimension is in the range of more than approximately 0.1 nanometers to less than approximately 50 nanometers.

19. A method of providing a molecular wire transistor comprising a pair of crossed wires, at least one of said wires comprising a doped semiconductor material, said method comprising:

providing a first wire having a first conductivity type and an external coating, and providing a second wire that crosses said first wire, said second wire having a second conductivity type opposite that of said first wire, said second wire having an external coating selected from either Lewis acid functional groups or Lewis base functional groups, wherein a junction with modulation doping is formed where said first and second wires cross, said modulation doping provided by said external coatings of said first and second wires.

* * * * *